(12) United States Patent
Potempka

(10) Patent No.: US 6,843,704 B2
(45) Date of Patent: Jan. 18, 2005

(54) METHOD AND APPARATUS FOR AUTOMATICALLY LOADING A DOUBLE-SIDED POLISHING MACHINE WITH WAFER CRYSTALS

(75) Inventor: Eberhard Potempka, Rendsburg (DE)

(73) Assignee: Peter Wolters Werkzeugmaschinen GmbH, Rendsburg (DE)

( * ) Notice: Subject to any disclaimer, the term of this patent is extended or adjusted under 35 U.S.C. 154(b) by 141 days.

(21) Appl. No.: 10/191,387

(22) Filed: Jul. 8, 2002

(65) Prior Publication Data

US 2003/0010887 A1 Jan. 16, 2003

(30) Foreign Application Priority Data

Jul. 11, 2001 (DE) .......................... 101 35 946

(51) Int. Cl.[7] .................. B24B 49/00; B24B 51/00; B24B 1/00
(52) U.S. Cl. .................. 451/5; 451/6; 451/8; 451/41; 451/59; 451/63; 451/261; 451/262; 451/339
(58) Field of Search .............................. 340/680; 451/5, 451/6, 8, 9, 10, 11, 41, 59, 63, 132–138, 261–265, 267, 269, 270, 271, 272, 273, 274, 339, 397, 398; 901/14, 16, 40, 46, 47

(56) References Cited

U.S. PATENT DOCUMENTS

| | | | |
|---|---|---|---|
| 5,174,067 A | * 12/1992 | Hasegawa et al. | .......... 451/291 |
| 5,333,413 A | * 8/1994 | Hashimoto | ...................... 451/9 |
| 5,679,055 A | * 10/1997 | Greene et al. | ................ 451/10 |
| 5,769,694 A | 6/1998 | Hesse et al. | |
| 5,779,525 A | 7/1998 | Boller | |
| 5,915,915 A | * 6/1999 | Allen et al. | .............. 414/744.1 |
| 6,050,885 A | 4/2000 | Morsch et al. | |
| 6,093,091 A | 7/2000 | Keller | |
| 6,135,854 A | * 10/2000 | Masumura et al. | ............ 451/6 |
| 6,361,418 B1 | * 3/2002 | Inada | .......................... 451/262 |
| 6,447,382 B1 | * 9/2002 | Potempka | .................... 451/332 |
| 6,516,244 B1 | * 2/2003 | Yoo et al. | .................... 700/218 |

FOREIGN PATENT DOCUMENTS

| | | |
|---|---|---|
| DE | 195 47 086 | 6/1997 |
| DE | 100 07 389 | 5/2001 |

* cited by examiner

Primary Examiner—Timothy V. Eley
(74) Attorney, Agent, or Firm—Faegre & Benson LLP

(57) ABSTRACT

A method and apparatus for automatically loading and unloading wafer crystals to and from a double-sided polishing machine of the type having an upper and a lower polishing plate, runner disks with reception openings for the wafer crystals, and a drive to move runner disks to a predetermined loading and unloading position. The position of the centers of the reception openings in a runner disk located in the loading position is measured and stored by means of an optical identification system. A gripping means of a robot arm is successively oriented towards the measured center positions of the reception openings, and the position of the centers of the individual openings is determined and stored by first and second optical identification systems. The individual wafer crystals are tilted while being inserted by the gripping means of the loading arm into the reception openings.

29 Claims, 6 Drawing Sheets

METHOD AND APPARATUS FOR AUTOMATICALLY LOADING A DOUBLE-SIDED POLISHING MACHINE WITH WAFER CRYSTALS

BACKGROUND OF THE INVENTION

The invention relates to a method for automatically loading a double-sided polishing machine with wafer crystals.

The manufacture of microelectronic components of a high integration density makes extreme requirements to the level of evenness, non-defectiveness, and roughness of manufactured wafer crystals. The last processing step is the polishing of the wafer crystal after it underwent grinding before. The requirements described are satisfied best by polishing the wafer crystal on either side. A so-called double-sided polishing machine is employed for this purpose.

A double-sided polishing machine is described in DE 195 47 086, for example. It features the fact that the wafer crystal lie in respective reception openings of so-called runner disks. The runner disk, in turn, lies on a lower polishing plate to which a polishing cloth is pasted. The runner disks are set moving and kept moving by means of a roll-off device. An upper polishing plate (to which a polishing cloth is pasted) is caused to travel onto the wafer crystals and double-sided polishing is performed by rotating the polishing plates while adding polishing agents.

The aforementioned document also describes how to bring the runner disks to a predetermined loading and unloading position. Runner disks usually have teeth at the circumference with inner and outer toothed or pinned rims. When the inner and/or outer toothed rim is set into rotation, the runner disks, in turn, are set into rotation while simultaneously moving about the vertical axis of the machine. Since the transmission ratios are known, a positioning drive allows each runner disk to be moved to in a desired position relative to a stationary point (the loading and unloading position).

From DE 100 07 389, it is further known to remove the wafer crystals from the double-sided polishing machine by means of an apparatus. The known device provides a suction head with a plurality of suction apertures by which all wafer crystals in a runner disk can be grasped at the same time. To this end, the suction head is rotatably supported about a vertical axis and may be brought into a rotary position in which the wafer crystals can be simultaneously grasped because of suction.

The double-sided polishing described for wafer crystals is a so-called batch process. It requires that a major number of wafer crystals be placed in the runner before the process starts. It is important for the production lines that the wafer crystals be positioned accurately and with no damaged edges in the correct order and without coming to float. Currently, insertion is by hand and involves the risk of the order not being observed, the edges getting damaged, and one or more wafer crystals coming to float at the beginning of the roll-off rotation and causing damage within the machine. The wafer crystals and the polishing cloth as well as the runner disks may be destroyed and provoke major damage and a production failure.

After the wafer crystals are unloaded, the double-sided polishing machine is rinsed to eliminate polishing agent residues and to keep the polishing cloth and runner disks wet. Polishing agents, when dried in place, involve the hazard of scratches during polishing. The rinsing operation soaks the cloth with water and results in water being trapped in the reception openings or nests. This water possibly leads to crystal floating as described with the undesirable consequences.

It is the object of the invention to describe a method for automatically loading wafer crystals into double-sided polishing machines of the type mentioned at the beginning which avoids damage to the edges and prevents the wafer crystals from floating. Moreover, it is intended to ensure that a predetermined order of the wafer crystals be observed.

SUMMARY OF THE INVENTION

In the inventive method, the position of the centers of the reception openings of a runner disk located in the loading position is measured more or less roughly and is stored by means of a first optical identification system. Subsequently, the gripping means of an arm of a robot are successively oriented towards the centers measured for the reception openings. While the respective loading arm or gripping means are being oriented, the precise position of the center of the individual reception openings is determined and stored by means of a second optical identification system mounted on the robot arm. In the process steps described, the robot arm serves as a second means of measurement to determine the precise position of the centers of the reception openings of the runner disk in its loading position. The first means of measurement is the first optical identification system which measures the position of the centers more or less accurately in a first step. It is understood that the coordinate system of the first optical identification system is related to that of the robot actuating the loading arm.

When the computer of the robot has stored the precise position of the centers of the reception openings, the insertion of the wafer crystals may take place with the aid of the loading arm and its gripping means. This is accomplished in a predetermined order in a respective runner disk reception opening by reception opening. Only after the runner disk is loaded is the next runner disk displaced to the loading position and the same operation as described above carried out.

The wafer crystal, while being transported by the robot arm and being oriented towards an associated reception opening, is oriented generally horizontal. However, if it is simply lowered into the reception opening, which would be possible with no damage to the edges, it would involve the danger of the crystal floating on the runner as described above. Therefore, a further aspect of the invention provides that the wafer crystal, after its orientation towards the reception opening, is initially lowered into the reception opening in a tilted position with a circumferential portion of the wafer crystal resting on an external area of the reception opening. The wafer crystal is subsequently tilted to a horizontal position until it is planarly received in the reception opening. Its insertion in an oblique position initially causes only relatively little water to be ousted from the reception opening. Its complete tilting into the reception opening causes the water to be increasingly ousted from the reception opening in one direction. The water is allowed to gather on the runner disk, but no longer causes the wafer crystal to float on the disk.

The operation as described may additionally be completed by the fact that the wafer crystal is temporarily set under a pressure or into rotation by means of the gripping means or the robot arm.

Before undergoing polishing, the wafer crystals are subjected to a grinding process. They are subsequently placed in cassettes to undergo further processing. The robot arm removes the wafer crystals from the cassette in order to insert them into the polishing machine afterwards. Although it is imaginable to dispose the cassettes so as to cause the robot arm to receive the wafer crystals correctly positioned, such an arrangement poses some problems. Therefore, according to another aspect of the invention, a provision is made for the loading arm to remove each of the wafer crystals individually from the cassette and to deposit them individually in a centering station. Subsequently, the gripping means grasp the wafer crystal from the centering station in an accurately centered position in order to insert them into a reception opening of the runner disk. It is also understood that an alternative is to make a separate transfer device insert the wafer crystal into the centering station.

It has turned out that the robot arm also makes it possible to remove the wafer crystals from the runner disks upon completion of the processing operation. To this effect, the position of the openings of the runner disks is determined again in the respective loading or unloading position of the runner disks. Such determination need not be as precise as in the loading operation because the gripping means may engage the wafer crystals also in a limited eccentric manner to remove them from within the openings of the runner disk. A determination of the location of the respective centers of the reception openings of the runner disk in the first step is relatively rapid because it may occur immediately after the upper working plate of the double-sided polishing machine is swung away. Now the wafer crystals are successively removed from within the runner disks preferably in the same order as they were inserted for loading, by means of the robot arm and its gripping means. Then, each wafer crystal is individually fed to the station which follows next, e.g. a wet depositing station. Here, the wafer crystal may be transported into the ready-for-use cassette via a water chute.

Runner disks normally are made of steel. It is known to form a border of a reception opening by a plastic frame, which is injection-molded into a contoured edge of the runner disk, with a view to avoiding damage to the wafer crystals at the border of the reception openings. For example, the steel border of the runner disk opening has a multiplicity of dovetailed profiles to ensure sufficient adherence of the plastic frame. The plastic may be transparent or may ever be colored dark. Therefore, to prevent the color of the plastic frame from affecting a measurement of the reception openings, an aspect of the invention provides that the first and/or second optical identification system detects the contoured edge of the runner disks.

The invention is also intended to provide an apparatus for automatically loading and unloading a double-sided polishing machine with wafer crystals. It comprises a multi-axis robot with an arm which has gripping means for grasping a wafer crystal on a surface. According to an aspect of the invention, the gripping means may be formed by suction cups which optionally may be brought into connection to a vacuum source. The arm or gripping means may be positioned as desired as is generally known for robots. A first optical identification system, the field of sight of which detects the reception openings of a runner disk in its loading position, measures the position of the centers with the center values being filed in a memory. Preferably, the first optical identification system is disposed stationarily, preferably at a relatively large height above the lower polishing plate. If the system operates sufficiently precise one identification system may be adequate. A second optical identification system may be mounted on the arm. The gripping means are oriented towards the centers of the reception openings by means of the coordinates for the center positions measured. Subsequently, the center positions are detected more accurately by means of the second optical identification system by a detection of two or more points lying on a diameter of the reception openings. The precise center values are stored, in turn. The precise coordinates of the respective center value provides for moving a grasped wafer crystal carried by the gripping means in order to insert it into the reception opening with no damage to its edges.

As was mentioned earlier the gripping means are designed to be tiltable. After the wafer crystal is inserted obliquely it will be tilted to be horizontal with the axis of swing being a tangent line at the outer circumference of the wafer crystal.

The invention will be explained in more detail below with reference to an embodiment shown in the drawings.

DETAILED DESCRIPTION

The invention and the embodiment described rely on a double-sided polishing machine which is known as such and is described in detail in DE 195 47 086 or DE 100 07 389. It has two polishing plates with the upper polishing plate being adapted to be pivoted away from the lower polishing plate to enable the loading and unloading of wafer crystals received in reception openings of runner disks which are disposed between the polishing plates and may be set into rotation and movement by means of an inner and an outer toothed or pinned rim.

Figure 1:
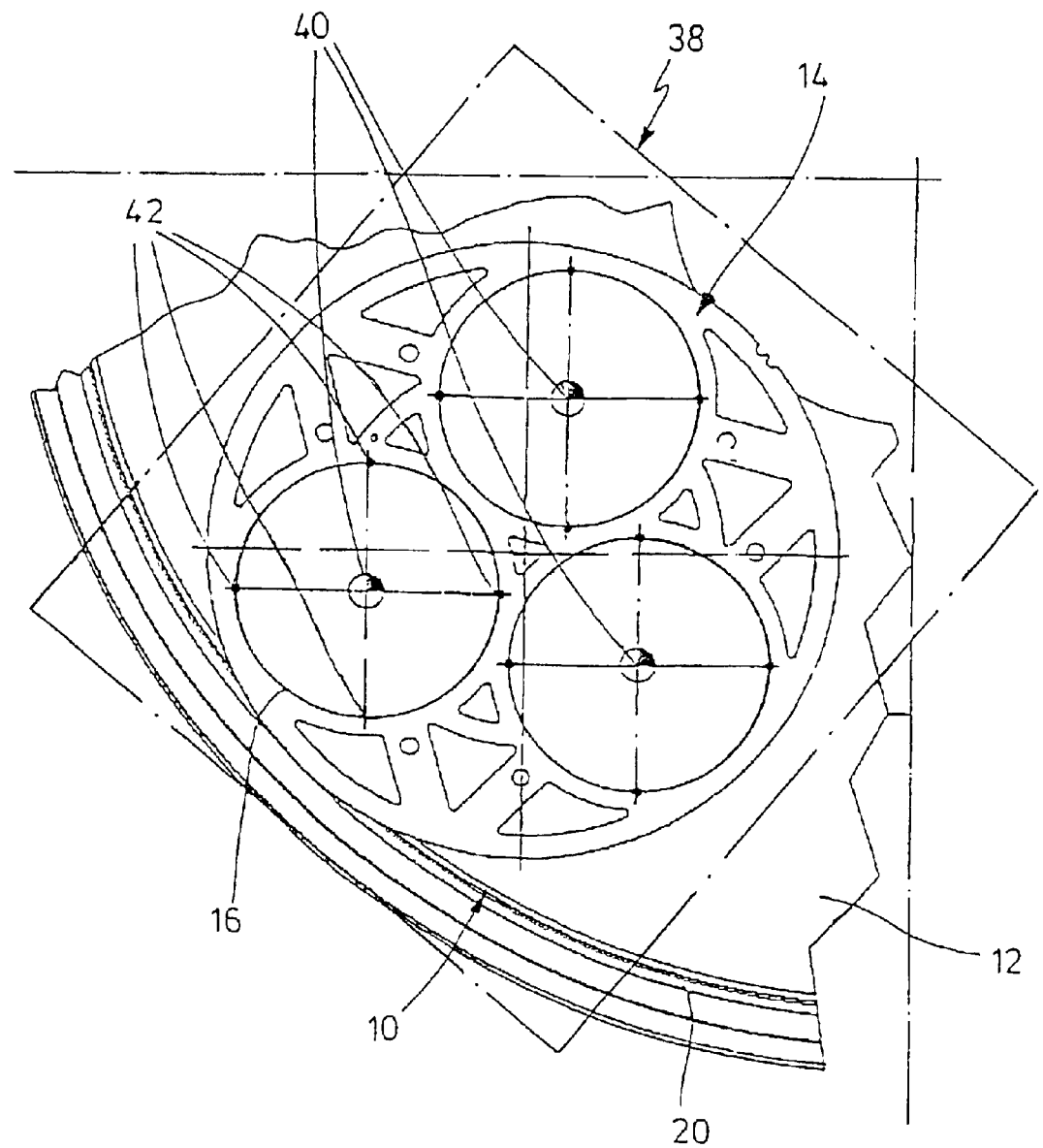
FIG. 1 schematically shows a portion of a plan view of a lower polishing plate of a double-sided polishing machine with a runner disk in its loading position.
Figure 3:
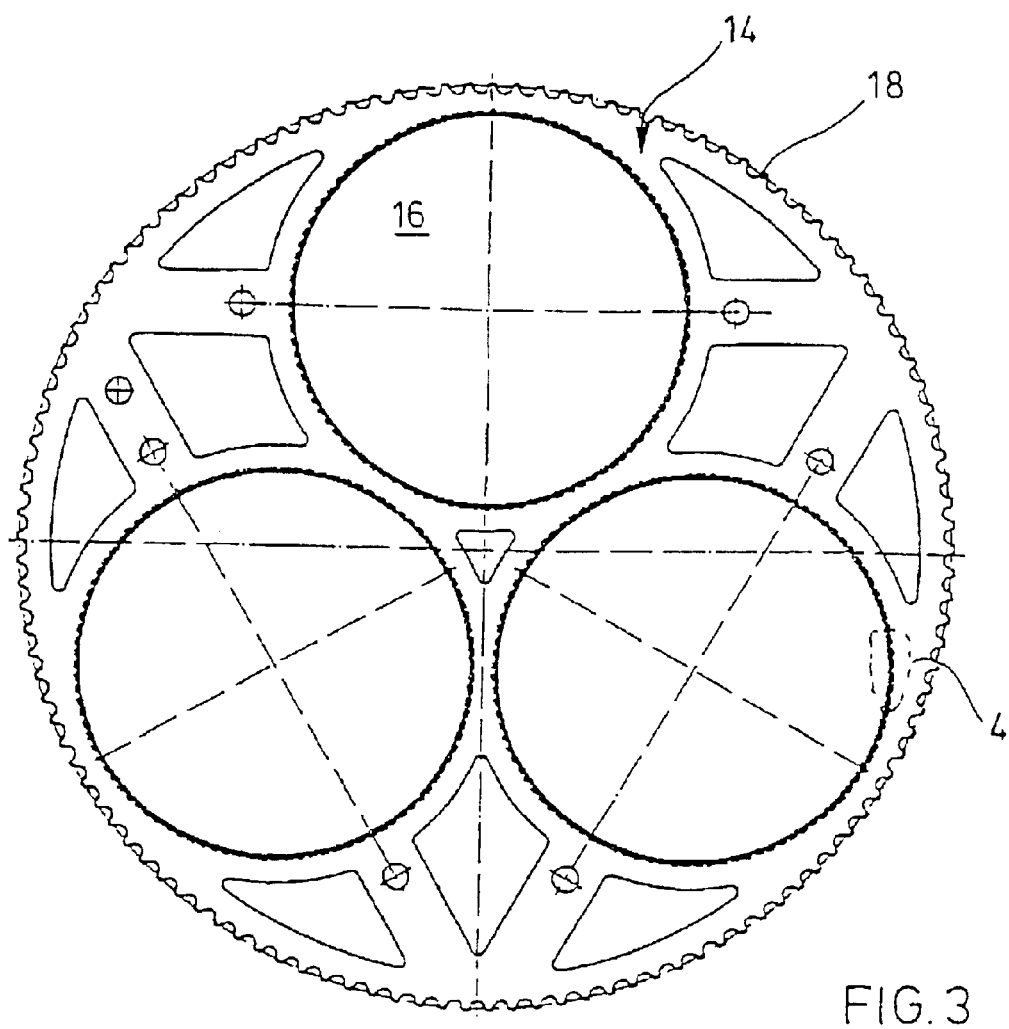
FIG. 3 shows an enlargement of the runner disk.
Figure 4:
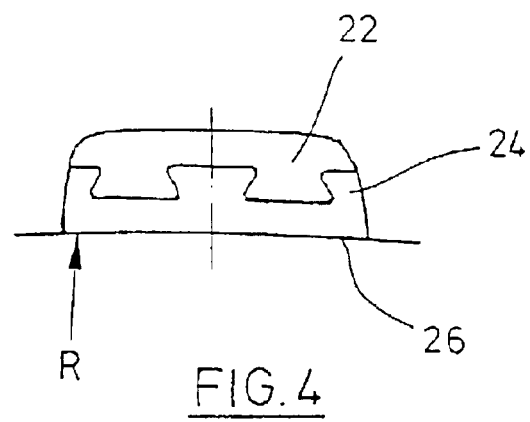
FIG. 4 shows an enlargement of a detail 4 of FIG. 3.

Referring to FIG. 1, a lower polishing plate 10 of a double-sided polishing machine is outlined to which a polishing cloth 12 is pasted. The polishing cloth, for example, has deposited thereon several runner disks, e.g. three or five, of which one is shown at 14 in FIGS. 1 and 2. The runner disk 14 has three reception openings 16. As can be recognized from FIG. 3 the flat runner disk 14 has circumferentially located thereon teeth 18 which engage inner and outer toothed or pinned rims of the double-sided polishing machine. The outer toothed or pinned rim is outlined at 20 in FIG. 1. As can be seen from FIG. 4 the edge of the reception openings 16 of the steel-made runner disks 14 is provided with a dovetailed contouring. A plastic frame 24 is injection-molded into the thus contoured edge 22. The inner edge 26 of the plastic frame 24 constitutes the opening edge for the reception opening 16. The radius R of edge 26 is minimally larger than the radius of a wafer crystal requiring reception, which is not shown in FIGS. 1 through 4. The radius R, for example, is 150.50 mm whereas the radius of the wafer crystal is 150 mm.

Figure 2:
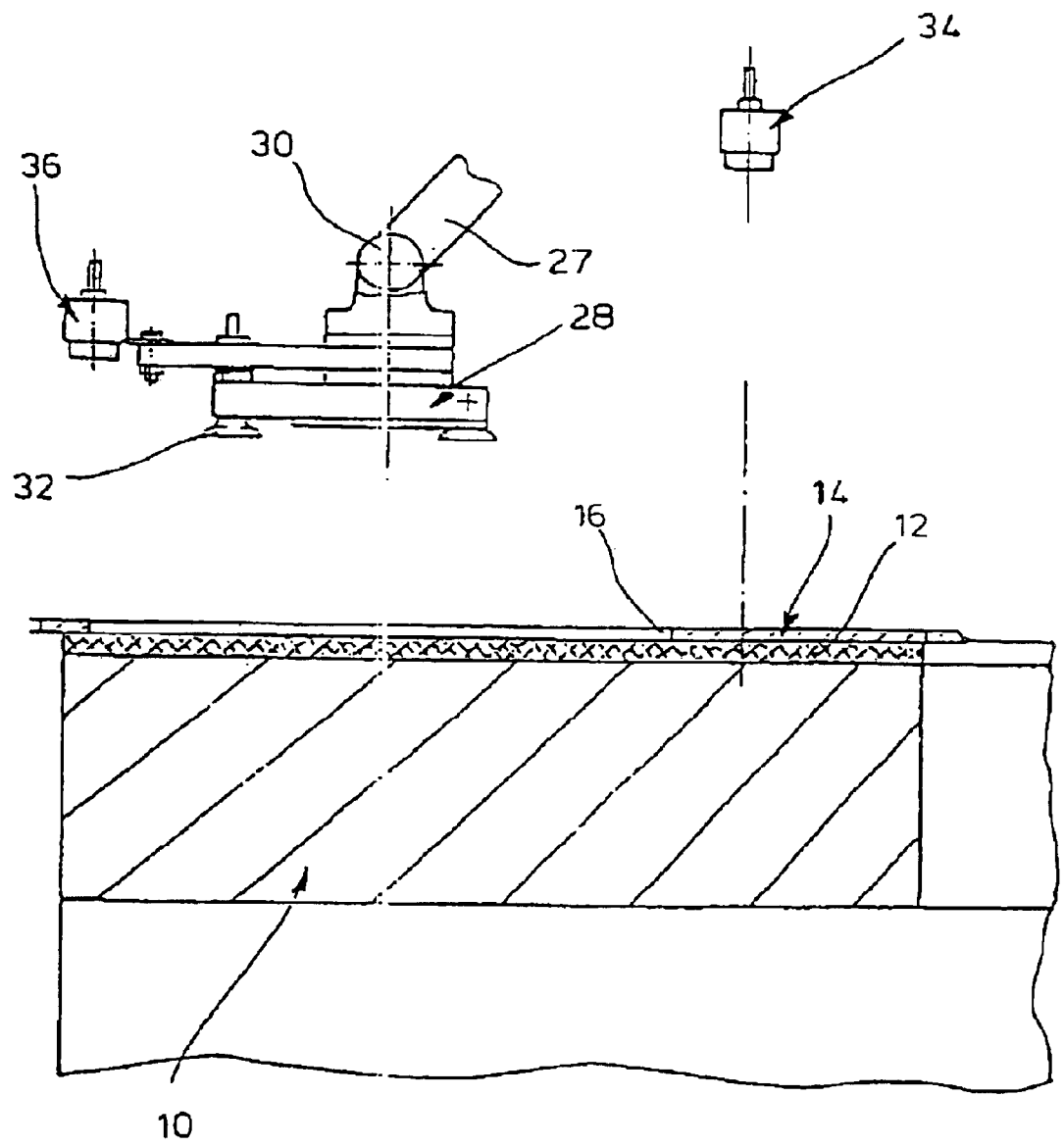
FIG. 2 shows a side elevation view of the lower polishing plate of FIG. 1 in a partial section and schematically shows a portion of the loading arm and gripping means of an apparatus according to the invention.

Referring to FIG. 2, a loading arm 27 of a loading robot (not shown in detail) with the arm having a loading head 28 hinged thereto at 30. The loading head 28 has three or more suction cups 32 which optionally may be connected to a vacuum source. The loading robot has a control with computing means for the functions yet to be described below.

Further referring to FIG. 2, a first optical identification system which is stationarily disposed is outlined at 34. A second optical identification system 36 is mounted on the loading head 28. The loading head 28 is an aid to successively insert wafer crystals (not shown) into the individual reception openings 16 of the runner disks 14. To this end, the individual runner disks are required to be brought to a loading position from time to time. DE 100 07 389, for example, describes in detail how to move the runner disks into a loading or unloading position. Let it be assumed that the runner disk 14 of FIG. 1 is in such a loading position. The first identification system 34, e.g. an appropriate digital camera, has a square field of sight 38 (see FIG. 1) in which the runner disk 14 is positioned. The identification system 34 may identify the reception openings 16 and measure the position of the centers 40 from their border. The position of the centers 40 and their coordinates are saved in an appropriate memory of the robot control.

Subsequently, the loading head 28, when in a non-loaded position, is oriented towards a first reception opening 16, e.g. the reception opening 16 which is leftmost in FIG. 1. This activation is accomplished with the aid of the coordinates stored for the center of this reception opening. However, the measurement made which is described for the position of the centers is not precise enough to allow an accurate transfer of wafer crystals into the reception opening. Therefore, whilst the loading head 28 is moved into the center position measured previously, another measurement is made by means of the second optical identification system 36 which can also be formed by a digital camera. This system can help, for example, in measuring a multiplicity of points 42 which are at the intersections of diameters with the edge of the reception openings 16. These points 42 allow a determination of the precise position of the center 40 and, hence, a correction of the center data saved before. Thus, the memory of the robot has saved therein the data for the precise center position of the reception opening 16. As to the other reception openings 16, the precise center positions are determined in the same manner which was just described.

After the measurement is completed a start may be made for the insertion of the wafer crystals into the reception openings 16 of the runner disk 14. This is illustrated in greater detail in FIGS. 5a through 5e.

Figure 5A:
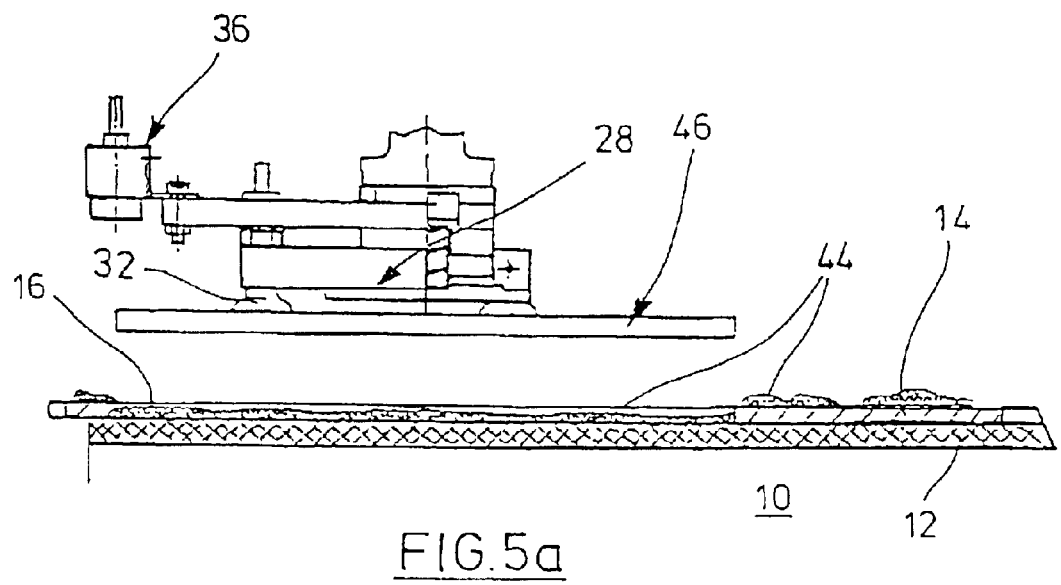
FIGS. 5a through 5e show a representation similar to FIG. 2 in different phases of inserting a wafer crystal into a reception opening of the runner disk using the gripping means.
Figure 5B:
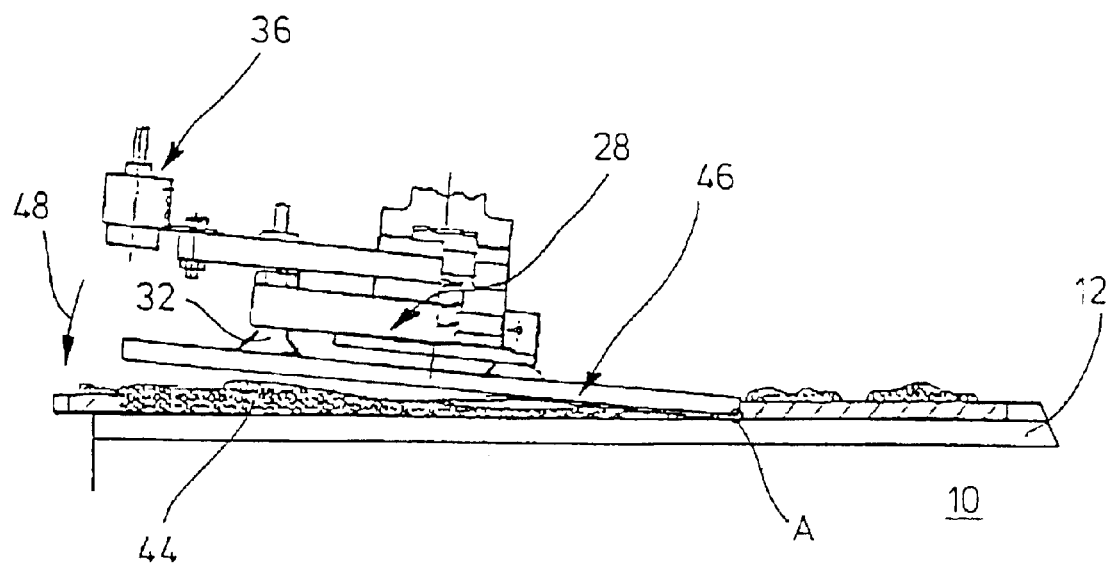
Figure 5C:
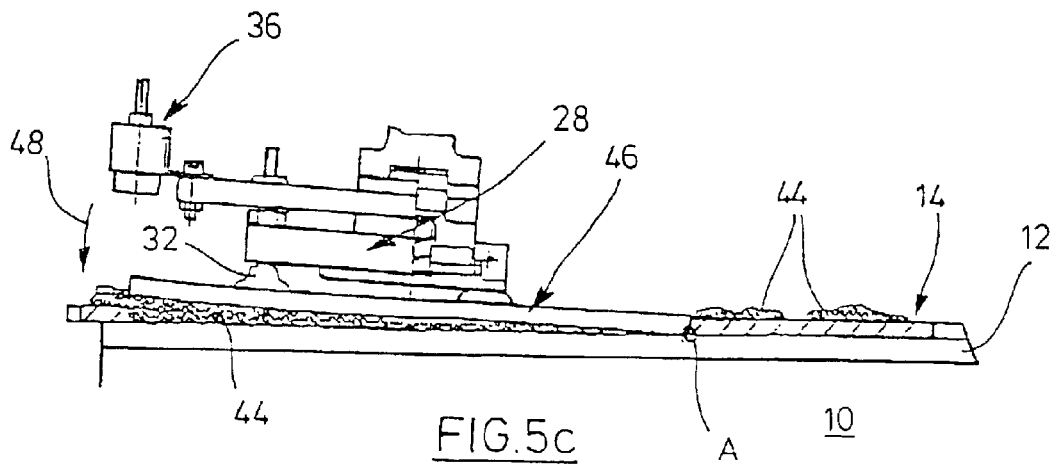
Figure 5D:
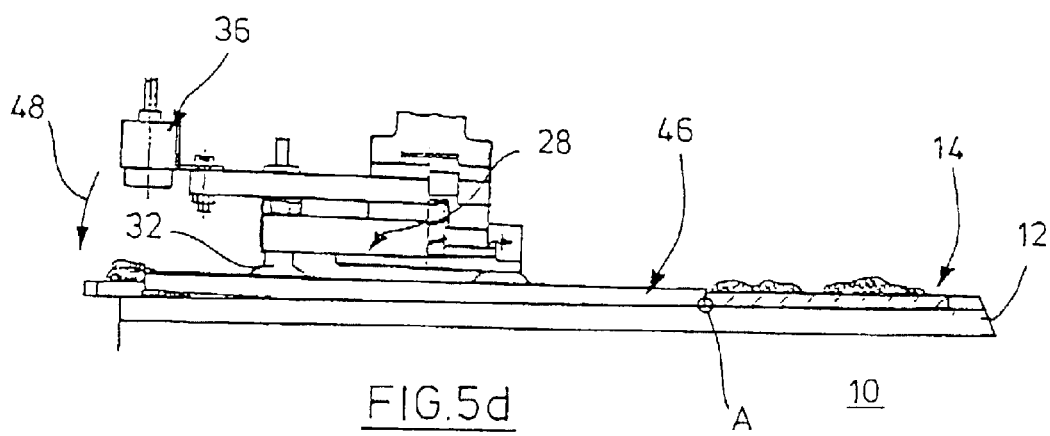
Figure 5E:
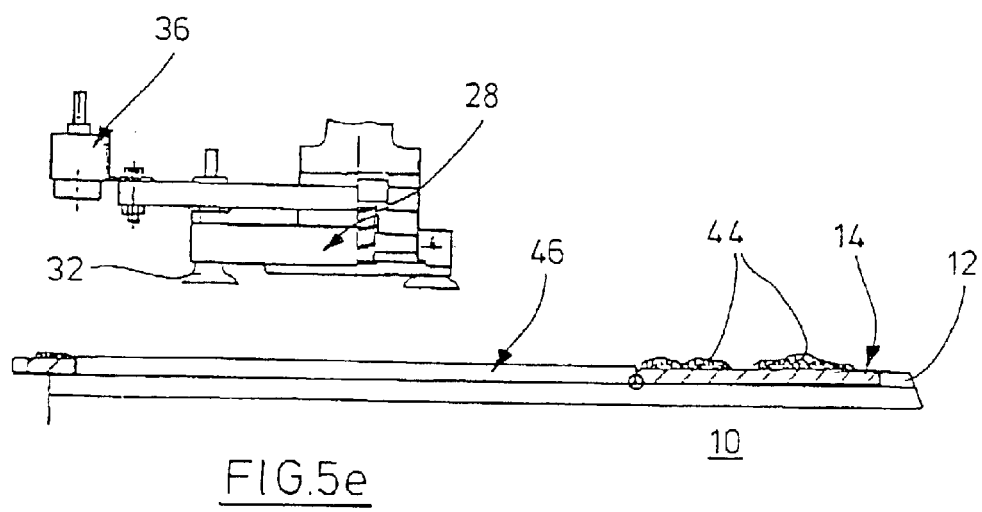

After every rinsing operation, DI (deionized) water 44 will be in the reception opening 16 of the runner disk 14 and on the disk itself. Using the robot which is not shown, the loading head 28 removes a wafer crystal from a cassette (not shown) containing a stack of pre-processed wafer crystals, deposits it in a centering station which is not shown either, releases from the wafer crystal in the centering station and, in a precisely centered condition, is again brought into engagement with the wafer crystal. Subsequently, the wafer crystal which is designated by 46 in FIGS. 5a through 5e is accurately oriented to the reception opening 16 of the runner disk 14 as is illustrated in FIG. 5a. Lowering and tilting the loading head 28 causes the wafer crystal 46 to be placed in the reception opening 16 in such a way that an external area of the wafer crystal 46 comes to rest in a point A on the edge of the reception opening 16. The water underneath the obliquely positioned wafer crystal 46 has a free space sufficient to undergo displacement. After this, the wafer crystal 46 is tilted about the point A (also see the arrows 48), which allows water 44 to escape in one direction (to the left in the Figures). FIGS. 5b through 5d illustrate how to insert the crystal while tilting it simultaneously. In FIG. 5e, the wafer crystal 46 is planarly positioned and is in the reception opening with no water film existing in the latter. The suction cups 32 are detached from the wafer crystal 46 and the water has been displaced from the reception opening 16 and gathers on the surface of the runner disk 14. Then, the loading head 28 may be set moving for the next loading operation. It takes the next wafer crystal out of the cassette, centers its receptacle in the centering station, and deposits the crystal in the next reception opening 16 in the manner described. This is accomplished in the manner described until all of the reception openings of the runner disk 14 are occupied. Subsequently, the next runner disk which is not shown is caused to travel to the loading position. The identification systems described again help determine the precise coordinates for the centers of the reception openings of this runner disk and loading is effected in the manner described until all of the runner disks of the double-side polishing machine (not shown) are loaded in a predetermined order. The known polishing process may then be initiated afterwards.

Figure 6:
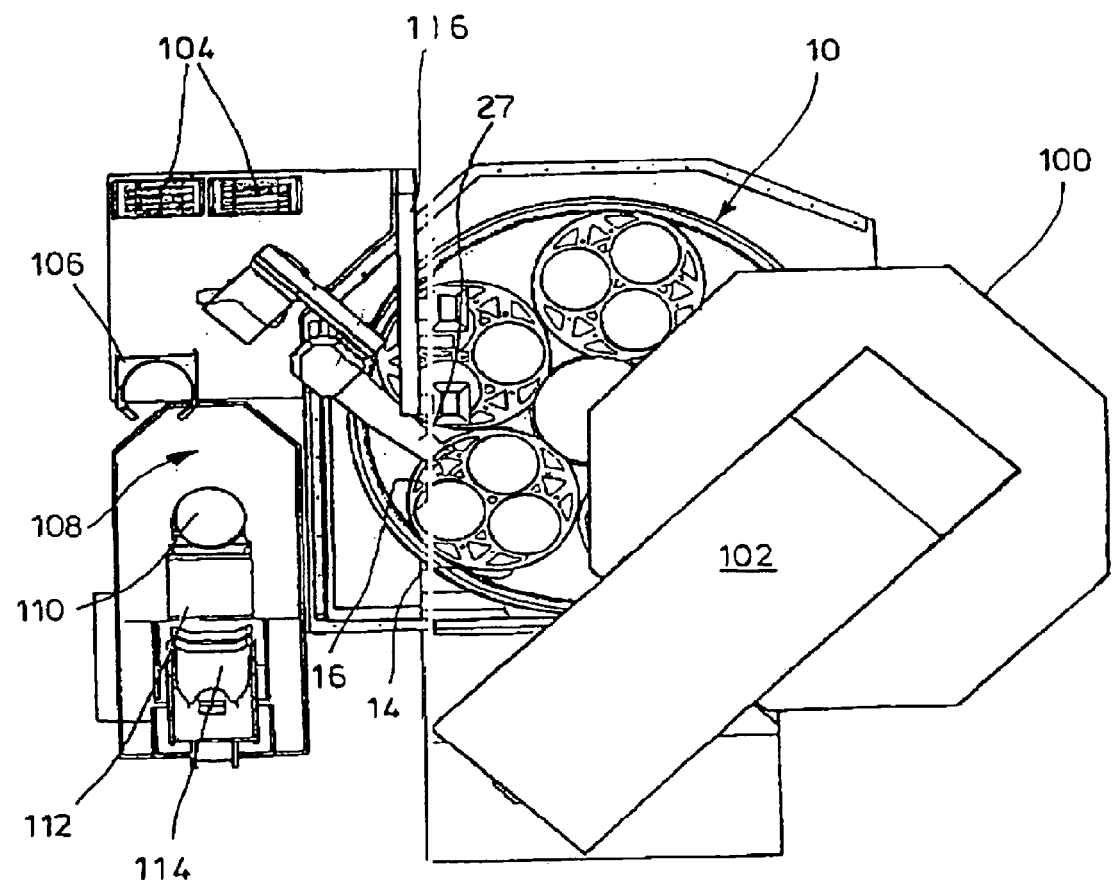
FIG. 6 schematically shows a plan view of the double-sided polishing machine of which only portions are shown above.

The robot which has been described already also allows unloading of the processed wafer crystals. This will be explained with reference to FIG. 6. In FIG. 6, the lower polishing plate 10 can be seen and so can the mounting 100 for the upper polishing plate which as is known as such is pivotally supported by means of an arm 102 and is also adjustable in height. What can also be seen is the arm 27 of the two-axis robot. Furthermore, there are provided two lifters 104 for wafer crystals, a centering station 106, a wet depositer 108, a wafer crystal shelf 110 as well as a water chute 112 and cassettes 114. Finally, an arm 116 is stationarily mounted and has a lighting device for the runner disks 14.

To effect loading, the robot arm 27 removes the wafer crystals from the lifters 104. They are initially passed into the centering station 106, whereupon they are grasped by the robot arm 27 a second time in a precisely centric position. Upon completion of the process, the runner disks 40 are positioned in the same way as described above or in the published application DE 100 07 389. The wafer crystals are also unloaded by means of the robot arm and the above described loading head or gripping device 28 with the suction cups 32 which were previously described a ready. The stationary optical identification device 34 is used again to detect the position of the reception openings 16 of the runner disks 14. It is unnecessary to accurately determine the center because a slight mismatch is uncritical for the suction cups. After the determination of the reception opening centers is completed the robot arm 27 together with gripping device 28 picks up the wafer crystals in the same order as these were inserted.

Each wafer crystal is fed to the shelf 110. Thence, the wafer crystal is fed to a cassette 114 kept ready for use via the water chute 112.

What is claimed is:

1. A method for automatically transferring wafer crystals with respect to a double-sided polishing machine of the type having an upper and a lower polishing plate, and runner disks resting on the lower polishing plate the runner disks having individual reception openings in the runner disks for the wafer crystals, and a controlled drive for moving the individual runner disks to a predetermined loading and unloading position, the method characterized by:

a) measuring and storing a position of each center of the respective reception openings in a runner disk located at a loading position using a first optical identification system;

b) successively orienting a gripping means of a loading arm of a robot without a wafer towards the measured center position of each of the reception openings;

c) determining and storing a more precise position of each of the centers of the respective individual reception openings using a second optical identification system mounted on the arm during the successive orientation of the gripping means; and d) inserting individual wafer crystals into respective reception openings of the runner disk in a predetermined sequence using the gripping means of the loading arm using the stored more precise positions.

2. The method of claim 1 wherein steps a) through d) are repeated for each individual runner disk successively located at the loading position in a predetermined order.

3. The method of claim 1 further characterized by an additional process of unloading of the wafer crystals, after undergoing loading and processing, according to the following steps:

e) determining a position of the wafer crystals in the unloading position of the runner disks using at least one of the optical identification systems, and f) removing the individual wafer crystals successively from within the runner disks for further processing using the gripping means of the robot arm.

4. The method according to claim 3, characterized in that the unloading of the wafer crystals is effected in the same order as the loading thereof.

5. The method according to claim 1, further characterized by the additional process of the following steps occurring before step d):

i) maintaining a plurality of wafer crystals in a cassette ready for insertion;

ii) depositing a wafer crystal received from a cassette in a centering station using the robot arm; and iii) grasping the wafer crystal from the centering station with the gripping means in a centered position.

6. The method according to claim 1 characterized in that the wafer crystals are subjected to a pressure during or after insertion.

7. The method according to claim 1 characterized in that the wafer crystal is set into rotation during or after insertion.

8. The method according to claim 1 characterized in that a border of the reception opening is formed by a plastic frame which is injection-molded into a contoured edge of the reception opening and that at least one of the first and second optical identification system detects the contcured edge.

9. A method for automatically operating a double-sided polishing machine with wafer crystals wherein the polishing machine is of the type having an upper and a lower polishing plate, runner disks resting on the lower polishing plate with reception openings for the wafer crystals, and a controlled drive by which the individual runner disks can be moved to a predetermined loading and unloading position, characterized by the following process steps:

a) measuring and storing a position of each center of respective reception openings in a runner disk located in the loading position using a first optical identification system;

b) moving individual wafer crystals from a ready position in a predetermined sequence using a gripping means of a robot arm;

c) orienting the gripping means of the robot arm towards the measured center positions of the reception openings; and d) initially inserting each wafer crystal into a respective reception opening in a tilted position with a circumferential portion resting on a surface of the reception opening, and subsequently tilting the wafer crystal to a horizontal position until it is planarly received in the reception opening.

10. The method of claim 9 wherein steps a) through d) are repeated for each of the individual runner disks as they are located in the loading position in a predetermined order.

11. The method of claim 9 wherein step c) is further characterized by determining and storing a more precise position of each of the centers of the individual openings using a second optical identification system mounted on the robot arm during the orienting of the gripping means.

12. The method of claim 9 further characterized by an additional process of unloading of the wafer crystals, after undergoing loading and processing, according to the following steps:

e) determining a position of the wafer crystals in the unloading position of the runner disks using the first optical identification system, and f) removing the individual wafer crystals successively from within the runner disks for further processing using the gripping means of the robot arm.

13. The method according to claim 12, characterized in that the unloading of the wafer crystals is effected in the same order as the loading thereof.

14. The method of claim 11 further characterized by an additional process of unloading of the wafer crystals, after undergoing loading and processing, according to the following steps:

e) determining a position of the wafer crystals in the unloading position of the runner disks using at least one of the first and second optical identification systems, and f) removing the individual wafer crystals successively from within the runner disks for further processing using the gripping means of the robot arm.

15. The method according to claim 14, characterized in that the unloading of the wafer crystals is effected in the same order as the loading thereof.

16. The method according to claim 9 wherein step b) is further characterized by:

i) maintaining a plurality of wafer crystals in a cassette ready for insertion, ii) depositing a wafer crystal received from a cassette in a centering station using the robot arm, and iii) grasping the wafer crystal from the centering station with the gripping means in a centered position.

17. The method according to claim 9 characterized in that the wafer crystal is subjected to a pressure during or after insertion.

18. The method according to claim 9 characterized in that the wafer crystal is set into rotation during or after insertion.

19. The method according to claim 9 characterized in that the border of the reception opening is formed by a plastic frame which is injection-molded into a contoured edge of the reception opening and that the first and/or second optical identification system detects the contoured edge.

20. An apparatus for automatically loading and unloading a double-sided polishing machine with wafer crystals wherein the polishing machine comprises an upper and a lower polishing plate, runner disks resting on the lower polishing plate, and a controlled drive by which also the individual runner disks can be moved to a predetermined loading and unloading position, characterized by:

a multi-axis robot with an arm which has gripping means for grasping a wafer crystal on a surface and is free to travel as directed by a robot control, a first optical identification system having a field of sight detecting a reception opening of a runner disk when the runner disk is in its loading position and measuring a position of the center of the reception opening with the center value being filed in a memory, and a second optical identification system which is mounted on the arm and which is adapted to detect at least two points lying on a diameter of a border of the reception opening after the gripping means is oriented with a higher resolution to the position of the center of the respective reception opening to determine a higher resolution center value of the respective reception opening, the higher resolution center value being stored in order to orient the wafer crystal grasped by the gripping means to the reception opening using the stored higher resolution center value.

21. The apparatus according to claim 20 characterized in that the first optical identification system is stationary.

22. The apparatus according to claim 21, characterized in that the first optical identification system is disposed above the arm.

23. The apparatus according to claim 20 characterized in that the first optical identification system has a camera including image evaluation.

24. The apparatus according to claim 20 characterized in that the second optical identification system has a camera including image evaluation.

25. The apparatus according to claim 20 characterized in that the gripping means includes at least one suction cup.

26. The apparatus of claim 25 characterized in that the at least one suction cup is provided with a vacuum.

27. The apparatus according to claim 20 characterized in that the gripping means is tiltable around a horizontal axis with respect to the arm about an axis along a tangent line to the border of a centrically received wafer crystal.

28. The apparatus according to claim 20 further characterized by:

a centering station in which a wafer crystal is centrically grasped by the gripping means.

29. The apparatus according to claim 20 further characterized by:

a wet depositing station for successively transporting the wafer crystals to a cassette.

* * * * *